United States Patent
Kuriyama et al.

[11] Patent Number: 6,166,405
[45] Date of Patent: Dec. 26, 2000

[54] SOLID-STATE IMAGING DEVICE

[75] Inventors: Toshihiro Kuriyama, Shiga; Syouji Tanaka, Nara, both of Japan

[73] Assignee: Matsushita Electronics Corporation, Osaka, Japan

[21] Appl. No.: 09/295,061

[22] Filed: Apr. 20, 1999

[30] Foreign Application Priority Data

Apr. 23, 1998 [JP] Japan .................................. 10-113357
Aug. 21, 1998 [JP] Japan .................................. 10-235826

[51] Int. Cl.$^7$ ...................... H01L 31/062; H01L 31/113; H01L 29/04; H01L 31/036
[52] U.S. Cl. .................... 257/290; 257/291; 257/292; 257/59; 257/72
[58] Field of Search .................... 257/290, 291, 257/292, 59, 72, 57, 293

[56] References Cited

U.S. PATENT DOCUMENTS

| | | | |
|---|---|---|---|
| 4,143,389 | 3/1979 | Koike et al. | 357/31 |
| 4,933,731 | 6/1990 | Kimura | 357/30 |
| 5,061,978 | 10/1991 | Mizutani et al. | 357/30 |
| 5,101,253 | 3/1992 | Mizutani et al. | 357/30 |

FOREIGN PATENT DOCUMENTS

| | | |
|---|---|---|
| 0 757 476 | 2/1997 | European Pat. Off. . |
| 57-71172 | 5/1982 | Japan . |
| 59-198756 | 11/1984 | Japan . |
| 60-18957 | 1/1985 | Japan . |
| 63-14466 | 1/1988 | Japan . |
| 3-107801 | 5/1991 | Japan . |
| 4-3588 | 1/1992 | Japan . |
| 4-152674 | 5/1992 | Japan . |
| 6-302798 | 10/1994 | Japan . |

*Primary Examiner*—Mahshid Saadat
*Assistant Examiner*—Jesse A Fenty
*Attorney, Agent, or Firm*—Merchant and Gould P.C.

[57] ABSTRACT

A solid-state imaging device comprises a plurality of pixels, each pixel comprising a semiconductor substrate; a photo-receiving portion formed in the semiconductor substrate; a detecting region formed in the semiconductor substrate; an insulating film formed on the semiconductor substrate, a gate electrode formed on the insulating film above the region between the photo-receiving portion and the detecting region; and a read-out circuit, which is electrically connected to the detecting portion. A reflection reducing film is formed on the insulating film above the region including at least one part of the photo-receiving portion and excluding at least one part of the detecting portion in the semiconductor substrate. With this solid-state imaging device and with the method for manufacturing the same, a highly sensitive MOS solid-state imaging device and the method for manufacturing the same are provided.

12 Claims, 10 Drawing Sheets

SOLID-STATE IMAGING DEVICE

FIELD OF THE INVENTION

The present invention relates to a MOS (metal oxide semiconductor) solid-state imaging device using MOS transistors for reading a signal and to a method of manufacturing the same.

BACKGROUND OF THE INVENTION

Solid-state imaging devices are generally classified into two categories according to the method by which a signal is read out: CCD devices, which use CCDs (charge coupled devices) to transfer signal charges and read a signal simultaneously from a plurality of pixels, and MOS devices, which use read-out circuits comprising MOS transistors, formed for each pixel, to read a signal by selecting one pixel after another.

In recent years, MOS solid-state imaging devices, especially CMOS solid-state imaging devices that are produced with a CMOS (complementary MOS) process, have received much attention as image input elements for portable imaging apparatus such as small PC cameras, because they can be driven with low voltage and low power consumption, and because they can be integrated on one chip together with peripheral circuits.

Figure 9:
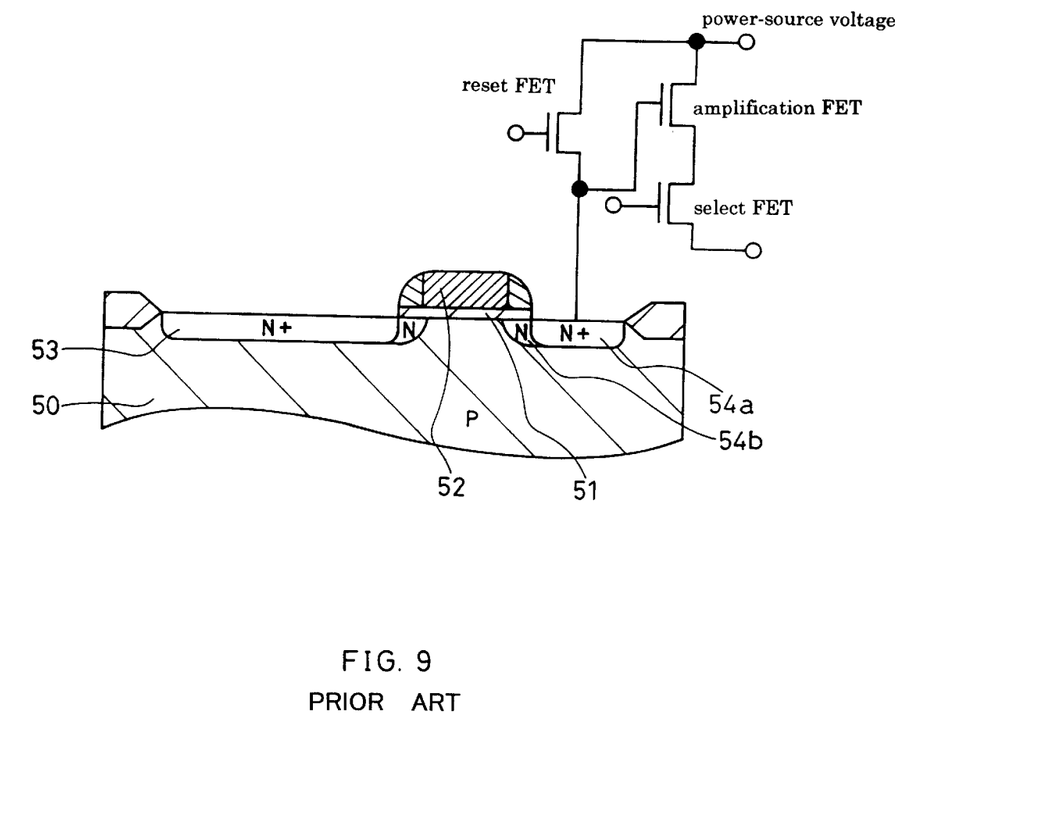
FIG. 9 is a cross-sectional view of an example of a conventional solid-state imaging device.
Figure 10:
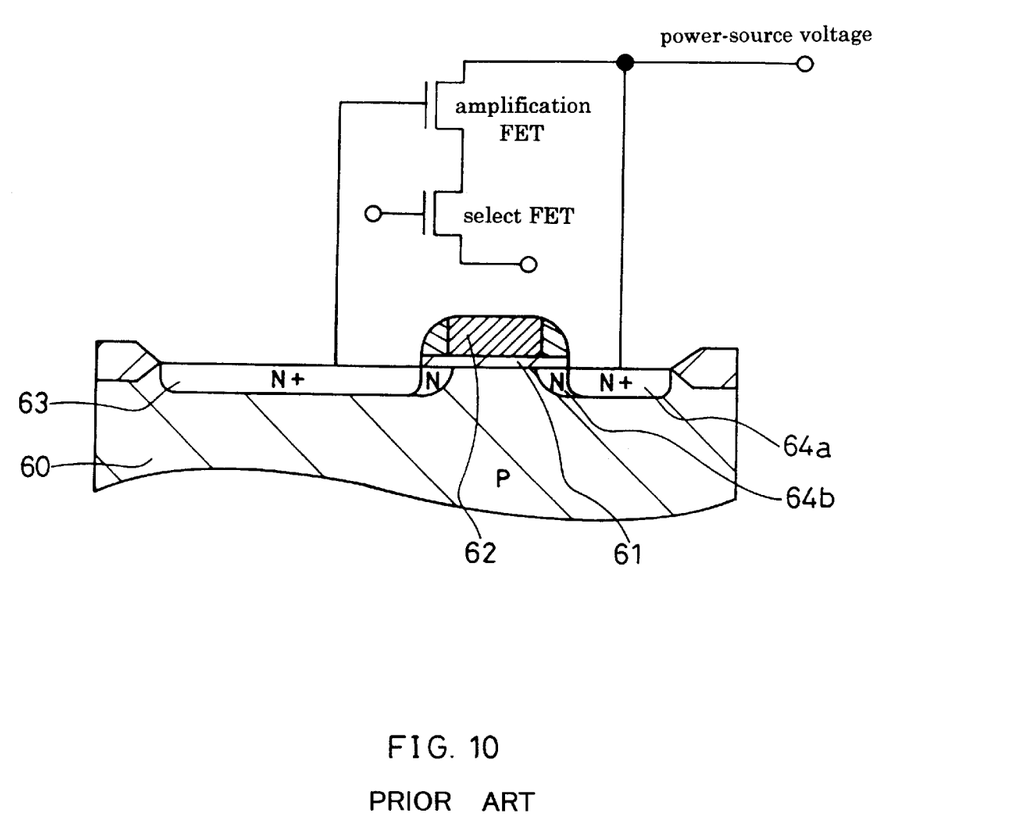
FIG. 10 is a cross-sectional view of another example of a conventional solid-state imaging device.

MOS solid-state imaging devices are classified into two categories according to the read-out circuit that is formed for each pixel: passive devices, which directly read the signal charge that accumulates in a photo-receiving portion into an output line, and active devices, which amplify the potential difference that occurs due to the accumulation of the signal charge with an amplifying circuit before giving it out. FIGS. 9 and 10 are cross-sectional views showing structures of pixels in conventional MOS solid-state imaging devices. FIG. 9 shows a pixel in an active solid-state imaging device. The signal charge is transferred from the photo-receiving portion to a detecting portion. The potential difference occurring at the detecting portion is given out. Each pixel comprises a photo-receiving portion and four transistors: a charge transfer transistor, an amplification transistor, a reset transistor and a select transistor. The charge transfer transistor is a MOS transistor including a photo-receiving portion 53, a detecting portion 54a and a lightly doped drain portion (hereinafter, referred to as "LDD portion") 54b, which are formed in a silicon substrate 50, an insulating film 51 formed on the silicon substrate 50, and a gate electrode 52 formed on the insulating film 51 between the photo-receiving portion 53 and the detecting portion 54a. The photo-receiving portion 53 corresponds to the source and the detecting portion 54a corresponds to the drain of the charge transfer transistor, respectively. FIG. 10 shows a pixel in an active solid-state imaging device giving out the potential difference occurring at the photo-receiving portion. Each pixel comprises a photo-receiving portion and three transistors: an amplification transistor, a reset transistor and a select transistor. The reset transistor is a MOS transistor including a photo-receiving portion 63, a charge drain portion 64a and a LDD portion 64b, which are formed in a silicon substrate 60, an insulating film 61 formed on the silicon substrate 60, and a gate electrode 62 formed on the insulating film 61 between the photo-receiving portion 63 and the charge drain portion 64a. The photo-receiving portion 63 corresponds to the source and the charge drain portion 64a corresponds to the drain of the reset transistor, respectively.

Not shown in the drawings, in the solid-state imaging devices shown in FIGS. 9 and 10, an interlayer insulating film made of silicon oxide film is formed on the photo-receiving portion. Furthermore, a light-blocking film made of metal having an aperture above the photo-receiving portion and a surface protection film are formed on the interlayer insulating film sequentially.

With increasing resolution of the solid-state imaging device and increasing miniaturization, the improvement of the sensitivity of the solid-state imaging device becomes an issue to be addressed. However, in conventional MOS solid-state imaging devices, an interlayer insulating film made of silicon oxide film is formed on the photo-receiving portion. According to the configuration, due to the difference of refractive index between the silicon substrate and the silicon oxide film, light reflects on the surface of the substrate and the amount of incident light that reaches the photo-receiving portion decreases. Accordingly, the sensitivity of the solid-state imaging devices decreases.

SUMMARY OF THE INVENTION

It is an object of the present invention to provide a highly sensitive solid-state imaging device and a method for manufacturing such a highly sensitive solid-state imaging device In order to attain the objects, a solid-state imaging device in accordance with the present invention comprises a plurality of pixels, each pixel comprising a semiconductor substrate, a photo-receiving portion formed in the semiconductor substrate, a diffusion region formed in the semiconductor substrate, a first insulating film formed on the semiconductor substrate, a gate electrode formed on the first insulating film at least between the photo-receiving portion and the diffusion region and a read-out circuit which is electrically connected to either one of the photo-receiving portion and the diffusion region. A reflection reducing film is formed on the first insulating film above a region of the semiconductor substrate including at least part of the photo-receiving portion and excluding at least part of the diffusion region.

According to the configuration, since the reflection reducing film is formed on the first insulating film above the photo-receiving portion, the loss of incident light due to the reflection on the surface of the substrate can be decreased by utilizing the optical interference effect caused by these films. Consequently, a highly sensitive solid-state imaging device can be attained.

In the solid-state imaging device, it is preferable that the reflection reducing film is formed not to be in contact with the side of the gate electrode near the diffusion region. According to the preferable configuration, there are not any steps or curves of the reflection reducing film in the electric field occurring near the diffusion region. Consequently, the deterioration of the quality of the image due to the stress of the reflection reducing film (particularly, silicon nitride film) can be suppressed.

It is preferable that the reflection reducing film is formed above a region of the semiconductor substrate excluding at least one part of the region on which the gate electrode is formed. In general, a process for supplying hydrogen to the substrate is performed to reduce dark currents, that is one of causes to deteriorate the quality of image. However, since it is difficult for hydrogen to permeate a reflection reducing film (particularly, silicon nitride film), the reflection reducing film might prevent hydrogen from being supplied with the substrate. However, according to the preferable example, the area of the region where the reflection reducing film is not formed can be attained sufficiently, and the process for supplying hydrogen with the substrate can be performed effectively. As a result, the deterioration of the quality of the image due to dark currents can be suppressed.

In the solid-state imaging device, it is preferable that the reflection reducing film includes a material whose refractive index is smaller than that of silicon and is larger than that of silicon oxide. Particularly, it is preferable that the reflection reducing film includes at least one material selecting from the group consisting of silicon nitride, silicon oxynitride, cerium oxide, titanium oxide, tantalum oxide and zirconium oxide. Examples of the reflection reducing film include a single layer film or a multiple layer film comprising the above-mentioned material.

In the solid-state imaging device, it is preferable that the thickness of the reflection reducing film is 20–100 nm.

In the solid-state imaging device, it is preferable that a second insulating film is formed on the reflection reducing film.

In the solid-state imaging device, it is preferable that the read-out circuit comprises an amplification transistor for amplifying an electrical signal corresponding to the light that is irradiated onto the photo-receiving portion. Thus, the output sensitivity of the signal can be increased.

An example for a pixel in such a solid-state imaging device is a pixel where the diffusion region is electrically connected to the gate electrode of the amplification transistor. Another example for a pixel in such a solid-state imaging device is a pixel where the photo-receiving portion is electrically connected to the gate electrode of the amplification transistor and the diffusion region is electrically connected to a power-source voltage.

In order to attain the objects, in a method for manufacturing a solid-state imaging device comprising a plurality of pixels in accordance with the present invention, wherein each pixel comprises a semiconductor substrate, a photo-receiving portion formed in the semiconductor substrate, a diffusion region formed in the semiconductor substrate, a first insulating film formed on the semiconductor substrate, a gate electrode formed on the first insulating film at least between the photo-receiving portion and the diffusion region and a read-out circuit which is electrically connected to either one of the photo-receiving portion and the diffusion region; the method comprises forming the first insulating film on the semiconductor substrate, forming the gate electrode on the first insulating film, forming the photo-receiving portion and the diffusion region in the semiconductor substrate, forming a reflection reducing film on the first insulating film above the photo-receiving portion and the diffusion region and etching the reflection reducing film in a manner that the part of the reflection reducing film that is above at least part of the diffusion region is removed.

According to the method for manufacturing the solid-state imaging device, a highly sensitive solid-state imaging device in which loss of incident light due to the reflection on the surface of the substrate can be suppressed can be attained.

Another method for manufacturing a solid-state imaging device in accordance with the present invention comprises forming a gate electrode on a first insulating film, which is formed on a semiconductor substrate, forming a photo-receiving portion in the semiconductor substrate near a first side of the gate electrode, forming a diffusion region in the semiconductor substrate near a second side of the gate electrode, forming a reflection reducing film on the first insulating film above the photo-receiving portion and the diffusion region and etching the reflection reducing film in a manner that the part of the reflection reducing film that is above at least part of the diffusion region is removed. Also according to this manufacturing method, a highly sensitive solid-state imaging device in which loss of incident light due to the reflection on the surface of the substrate can be suppressed, can be attained.

In the method for manufacturing the solid-state imaging device, it is preferable that a step for etching the reflection reducing film is performed in a manner that the part of the reflection reducing film that is in contact with a side of the gate electrode near the diffusion region is removed.

In the method for manufacturing the solid-state imaging device, it is preferable that a step for etching the reflection reducing film is performed in a manner that the part of the reflection reducing film that is over at least part of the gate electrode is removed.

In the method for manufacturing the solid-state imaging device, it is preferable that the reflection reducing film includes a material whose refractive index is smaller than that of silicon and is larger than that of silicon oxide. Particularly, it is preferable that the reflection reducing film includes at least one material selecting from the group consisting of silicon nitride, silicon oxynitride, cerium oxide, titanium oxide, tantalum oxide and zirconium oxide. Examples of the reflection reducing film include a single layer film or a multiple layer film comprising the above-mentioned material film.

In the method for manufacturing the solid-state imaging device, it is preferable that the thickness of the reflection reducing film is 20–100 nm.

DESCRIPTION OF THE PREFERRED EMBODIMENTS

In the solid-state imaging device of the present invention, there is no particular limitation regarding the circuit arrangement of the pixels, as long as each pixel comprises a semiconductor substrate, a photo-receiving portion, a diffusion region, a gate electrode formed above the semiconductor substrate at least between the photo-receiving portion and the diffusion region, and a read-out circuit connected to the photo-receiving portion or to the diffusion region. The solid-state imaging device can be the active type or the passive type. In the following, embodiments of the present invention will be explained by giving examples in which the present invention is applied to an active solid-state imaging device.

First Embodiment

Figure 1:
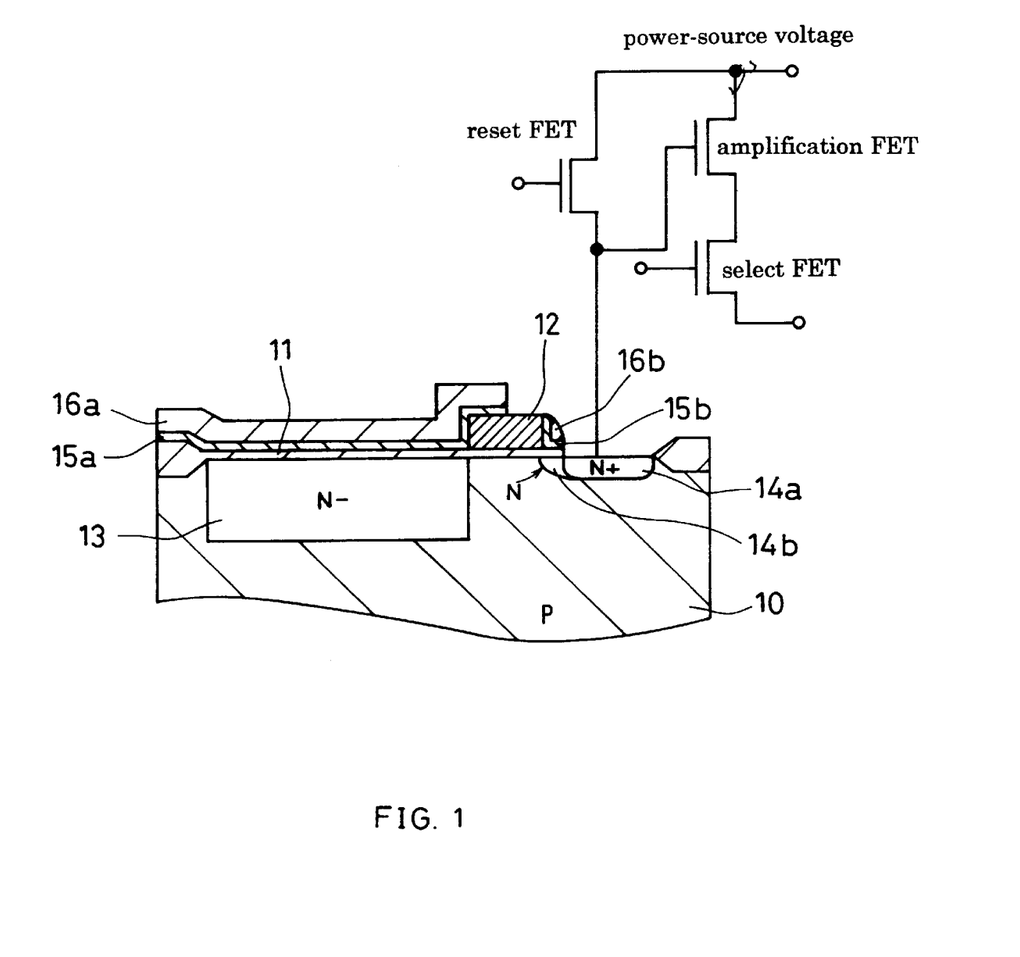
FIG. 1 is a cross-sectional view of an example of a solid-state imaging device in accordance with a first embodiment of the present invention.

FIG. 1 is a cross-sectional view of an example of a solid-state imaging device in accordance with a first embodiment of the present invention. This solid-state imaging device transfers a signal charge from a photo-receiving portion to a detecting portion, and gives out the potential difference occurring at the detecting portion. Each pixel comprises a photo-receiving portion 13 and four transistors: a charge transfer transistor, an amplification transistor, a reset transistor and a select transistor. The charge transfer transistor takes the photo-receiving portion 13 as the source. The drain of the charge transfer transistor is a diffusion region 14a, which is electrically connected to the gate of the amplification transistor. The source of the amplification transistor is electrically connected to a power-source voltage, and the drain of the amplification transistor is electrically connected to the source of the select transistor, respectively. The source of the reset transistor is electrically connected to the diffusion region 14a, and the drain of the reset transistor is electrically connected to the power-source voltage, respectively. The drain of the select transistor is connected to an output line.

The following is an outline of the role of each transistor. The charge transfer transistor transfers a signal charge, which has been generated in the photo-receiving portion 13 by photoelectric conversion, to the diffusion region 14a. The diffusion region 14a functions as a detecting portion for holding the signal charge and providing the amplification transistor with a voltage that is proportional to the charge (hereinafter, the diffusion region 14a is referred to as "detecting portion"). The amplification transistor amplifies the voltage provided by the detecting portion 14a. The select transistor acts as a switch for receiving the output from the amplification transistor, and selects the pixel from which the signal is read out. The read-out circuit in the pixels in this solid-state imaging device is the amplification circuit comprising the amplification transistor and the select transistor. The reset transistor periodically releases the signal charge held by the detecting portion 14a toward the power-source voltage.

The following is a more detailed explanation of the region forming the charge transfer transistor in the pixel. In this region, the photo-receiving portion 13 and the detecting portion 14a, which are n-type diffusion regions, are formed in the p-type silicon substrate 10. An insulating film 11 is formed on the silicon substrate 10 and a gate electrode 12 (hereinafter, referred to as "transfer gate electrode") is formed on the insulation film above the region between the photo-receiving portion 13 and the detecting portion 14a.

Although there is no particular limitation concerning the impurity concentration in the photo-receiving portion 13, other than that it should be suitable for photoelectric conversion, it is preferable that the impurity concentration is about $10^{15}$–$10^{16}$ cm$^{-3}$. It is preferable that the diffusion depth is about 0.5–2.0 μm. Further, the photo-receiving portion 13 may be a buried photodiode comprising the p-type diffusion region at an upper portion to reduce dark currents. In this case, in the p-type diffusion region formed at an upper portion of the photo-receiving portion, it is appropriate that the impurity concentration is about $10^{17}$–$10^{19}$ cm$^{-3}$ and the diffusion depth is about 0.2–0.6 μm. Although there is no particular limitation concerning the impurity concentration in the detecting portion 14a, other than that it should be suitable for an electrical connection with the metal wiring, it is preferable that the impurity concentration is $10^{20}$ cm$^{-3}$ or more. Further, it is appropriate that the diffusion depth is about 0.2–0.4 μm. Further, it is preferable that an n-type diffusion region 14b (hereinafter, referred to as "LDD (lightly doped drain) portion"), with a lower impurity concentration than that of the detecting portion 14a, is formed at the end of the detecting portion 14a near the transfer gate electrode 12. This is because the LDD portion can suppress deterioration of the element properties. It is appropriate that the impurity concentration in the LDD portion 14b is about $10^{18}$–$10^{19}$ cm$^{-3}$. Furthermore, not shown in the drawings, an interlayer insulating film, a light-blocking film made of metal having an aperture above the photo-receiving portion and a surface protection film are formed above the substrate sequentially.

In the solid-state imaging device in accordance with the present invention, a reflection reducing film 15a is formed on the insulating film 11 above the photo-receiving portion 13. Since the reflection reducing film 15a is formed on the insulating film 11, the sensitivity can be improved by reducing the optical reflections on the surface of the substrate by utilizing the optical interference effect caused by the reflection reducing film 15a, the insulating film 11 and the interlayer insulating film.

For example, when a silicon oxide film having a thickness of 9 nm as the insulating film 11 and a silicon nitride film having a thickness of 20 nm as the reflection reducing film 15a are formed in the solid-state imaging device as shown in FIG. 1, it is possible that the reflectance of visible light on the surface of the substrate can be made 10%. On the other hand, the reflectance of visible light on the surface of the substrate of the solid-state imaging device, having the same configuration except that the reflection reducing film is not provided, is about 25%. That is, apparently, the solid-state imaging device as shown in FIG. 1 can attain the lower reflectance of visible light on the surface of the substrate. Although the reflection reducing film 15a may be formed to cover at least one part of the photo-receiving portion 13, it is preferable that the reflection reducing film 15a is formed to cover the entire photo-receiving portion 13, since the sensitivity can be improved securely by covering the larger area of the photo-receiving portion with the reflection reducing film 15a. Further, it is preferable that the reflection reducing films 15a is formed to cover also a part of the transfer gate electrode 12 so as to cover the entire part of the photo-receiving portion 13 securely. In this case, it is preferable that the reflection reducing film is not formed on at least part of the gate electrode so as to permit the effective supply of hydrogen to the substrate to decrease dark currents.

On the detecting portion 14a, it is not particularly required to form the reflection reducing film and rather than that, it is preferable not to form the reflection reducing films on at least part of the detecting portion. This is because it is required for at least part of the detecting portion to connect with the metal wiring in order to connect electrically the detecting portion with the amplification transistor. Moreover, it is preferable that the reflection reducing film is not formed above the entire part of the detecting portion 14a excluding the LDD portion 14b. As will be mentioned later, it is required for the detecting portion 14a to secure the impurity concentration suitable for electrical connection with metal wiring, therefore ions are implanted more times in the detecting portion 14a than in the LDD portion 14b. Consequently, if the reflection reducing film is formed above the entire part of the detecting portion 14a, it is required to perform all steps for implanting ions before the reflection reducing film is formed above the detecting portion 14a, and therefore it becomes difficult to simplify the process for manufacturing the solid-state imaging device.

Any material, that can form a film and has the refractive index between that of silicon (about 3.49) and that of silicon oxide (about 1.46), may be used for forming the reflection reducing film 15a. Although the material includes, for example, silicon nitride film, silicon oxynitride film, cerium oxide film, titanium oxide film, tantalum oxide film, zirconium oxide film and mixtures thereof, it is preferable that a film including silicon nitride is used. Further, the reflection reducing film may have a single layer structure or multi-layer structure. The multi-layer structure includes examples in which a plurality of the above-mentioned films are laminated, and a silicon oxide film is laminated with these films.

It is preferable that the thickness of the reflection reducing film is 20–100 nm, more preferable that 40–70 nm, further preferably about 60 nm.

In the solid-state imaging device as shown in FIG. 1, the silicon oxide film 16a is formed on the reflection reducing film 15a. At the side of the transfer gate electrode 12 near the detecting portion 14a, a film 15b made of the material same as that of the reflection reducing film and a side wallformed silicon oxide film 16b are formed.

FIGS. 2(a)–(d) are cross-sectional views illustrating one example of the steps for manufacturing a solid-state imaging device in accordance with this embodiment. FIGS. 2(a)–(d) illustrate the steps for manufacturing a charge transfer transistor in the pixels. In the following, "diffusion region" means the region 14a in FIG. 1, and "LDD portion" means the region 14b in FIG. 1.

Figure 2:
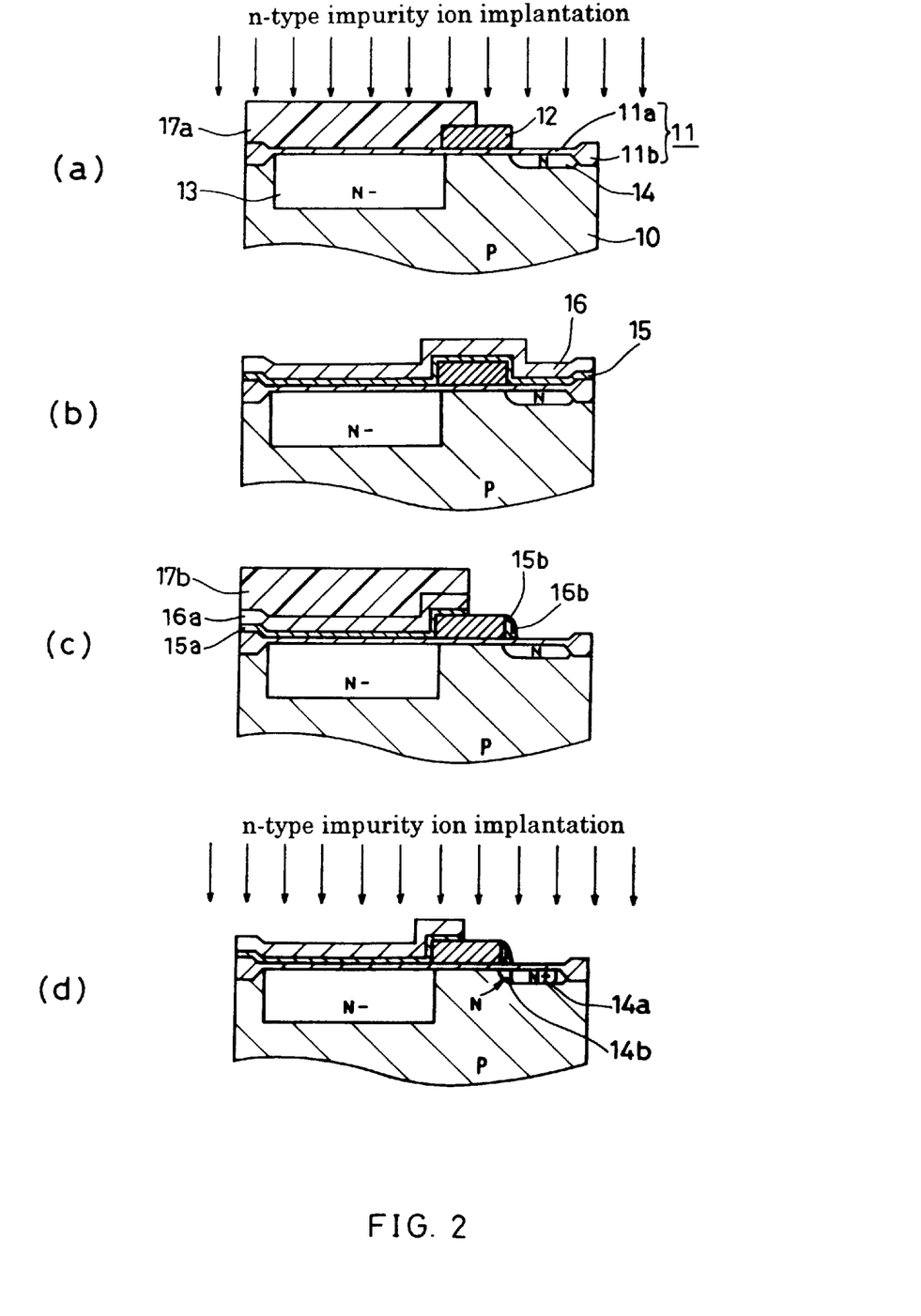
FIGS. 2(a) to 2(d) are cross-sectional views illustrating an example of a process for manufacturing a solid-state imaging device in accordance with the first embodiment of the present invention.

First of all, a gate insulating film 11a and a field insulating film 11b (both of which are silicon oxide films) are formed by thermal oxidation of a p-type silicon substrate 10. Preferably, the thickness of the gate insulating film 11a is about 10–20 nm, and the thickness of the field insulating film 11b is about 300–500 nm. The field insulating film 11b can be formed by LOCOS (local oxidation of silicon), that is thermal oxidation performed after covering the field portion (the portion forming the element) with a silicon nitride film. Then, a polycrystalline silicon film of about 250–400 nm thickness is formed on the insulating film 11 with low-pressure CVD. This polycrystalline silicon film is partially removed by etching to form the transfer gate electrode 12. Then, n-type impurities, such as arsenic or phosphorus, are implanted into the silicon substrate 10 to form the photo-receiving portion 13. The ion implantation is performed with an acceleration field strength of about 600 keV and an implantation dose of about $10^{11}$–$10^{12} cm^{-2}$.

Then, n-type impurities are implanted into the silicon substrate 10 to form the detecting portion and the LDD portion while the photo-receiving portion 13, which was formed prior to this process, is covered with the resist 17a (FIG. 2(a)). In FIG. 2(a), the detecting portion and the LDD portion are denoted by numeral 14. At this stage, the impurity concentration in the detecting portion is the same as that in the LDD portion, preferably about $10^{18}$–$10^{19} cm^{-3}$. It is preferable that this ion implantation is repeated several times while changing the orientation of the substrate.

After the resist 17a is removed, a silicon nitride film 15 is formed above the silicon substrate 10 in which the photo-receiving portion 13 and the detecting portion were formed. Then, a silicon oxide film 16 is formed on the silicon nitride film 15 (FIG. 2(b)). The silicon nitride film 15 can be formed by low-pressure CVD. Its thickness can be about 20–100 nm, preferably about 40–70-nm and more preferably about 60 nm. Further, the silicon oxide film 16 can be formed by low-pressure CVD using TEOS (tetraethyl orthosilicate). Its thickness is preferably about 100–200 nm, more preferably about 130 nm.

Then, one portion of the silicon oxide film 16 and the silicon nitride film 15 are removed by dry-etching such as reactive ion etching (RIE) (FIG. 2(c)). The remaining silicon oxide films 16a and 16b, silicon nitride films 15a and 15b function as masks for the second implantation in a later step. This etching concerns the oxide film and the nitride film formed above the region excluding at least one part of the photo-receiving portion 13. In other words, the etching concerns the oxide film and the nitride film formed above the detecting portion, and preferably at least one part of the transfer gate electrode 12. This etching is performed after a resist 17b is formed to cover at least part of the photo-receiving portion 13, preferably to cover the entire of the photo-receiving portion 13 and part of the transfer gate electrode, in order to protect the oxide film and the nitride film above the photo-receiving portion 13. As a result, the silicon nitride film above the detecting portion is removed and the silicon nitride film 15a above the photo-receiving portion 13 remains and functions as a reflection reducing film. Further, the silicon oxide film 16a functions as a part of an interlayer insulating film.

Furthermore, this etching is performed in a manner that the oxide film above the LDD portion remains. The oxide film 16b above the LDD portion can be maintained without using a special resist, just by adjusting conditions such as the etching time. An oxide film formed by breaking down the TEOS under low-pressure is formed substantially homogeneously on all surfaces of the steps formed on the substrate, so that the thickness (measured perpendicularly from the substrate surface) of the oxide film of the portion near the transfer gate electrode (that is, on the LDD portion) becomes larger than the thickness at other portions. Thus, if an anisotropic etching technique such as dry-etching is used, the oxide film 16b above the LDD portion can be maintained.

After the resist 17b has been removed, another ion implantation is performed (FIG. 2(d)). The impurity concentration in the detecting portion 14a is increased by this ion implantation. This ion implantation is performed with an acceleration field strength of 20–30 keV and an implantation dose of about $5 \times 10^{15} cm^{-2}$. The impurity concentration in the LDD portion 14b becomes, of course, lower than the impurity concentration in the detecting portion 14a, because the LDD portion 14b is masked by the silicon oxide film 16b and not subjected to ion implantation. According to the above-mentioned processes, the charge transfer transistor of the solid-state imaging device in the embodiment is formed.

An interlayer insulating film is formed above the silicon substrate whereon the charge transfer transistor has been formed. For this interlayer insulating film, a silicon oxide film formed by low-pressure CVD can be used for example. Then, after a hole has been formed in the interlayer insulating film above the detecting portion 14a, a metal film of, for example, aluminum is formed. This metal film is patterned by etching to form the metal wiring. The metal wiring connects electrically the detecting portion 14a to the amplification transistor formed in another region of the silicon substrate 10, through the hole in the interlayer insulating film.

Furthermore, a light-blocking film made of metal having an aperture at a portion corresponding to the photo-receiving portion, a surface protection film, and the like are formed as appropriate. Although there are no particular limitations concerning the light-blocking film and the surface protection film, an aluminum film can be used for the light-blocking film, and a silicon nitride film formed by plasma CVD can be used for the surface protection film.

In the above-mentioned manufacturing method, although the silicon nitride film is used as the reflection reducing film, other material mentioned above can be used. Further, the formation of films by thermal oxidation, CVD etc. or the etching in the above-mentioned manufacturing method can be selected from methods well known in the art.

Second Embodiment

In the solid-state imaging device in the first embodiment, when the material including the silicon nitride is used as a reflection reducing film particularly, it is preferable that there is not any discontinuous part, such as steps or curves, of the reflection reducing film, formed above the detecting portion (including LDD portion) near the transfer gate electrode. In other words, it is preferable that the reflection reducing film is not contacted with side of the transfer gate electrode near the detecting portion. Further, it is preferable that the reflection reducing film is not formed above the LDD portion. This is because if a silicon nitride film, especially a nitride silicon film having steps or curves, is formed in the strong electric field occurring between the transfer gate electrode and the detecting portion, due to the inner stress of the nitride film, the deterioration of the image quality might occur. A second embodiment of this invention as the above-mentioned preferable example will be explained in the following.

Figure 3:
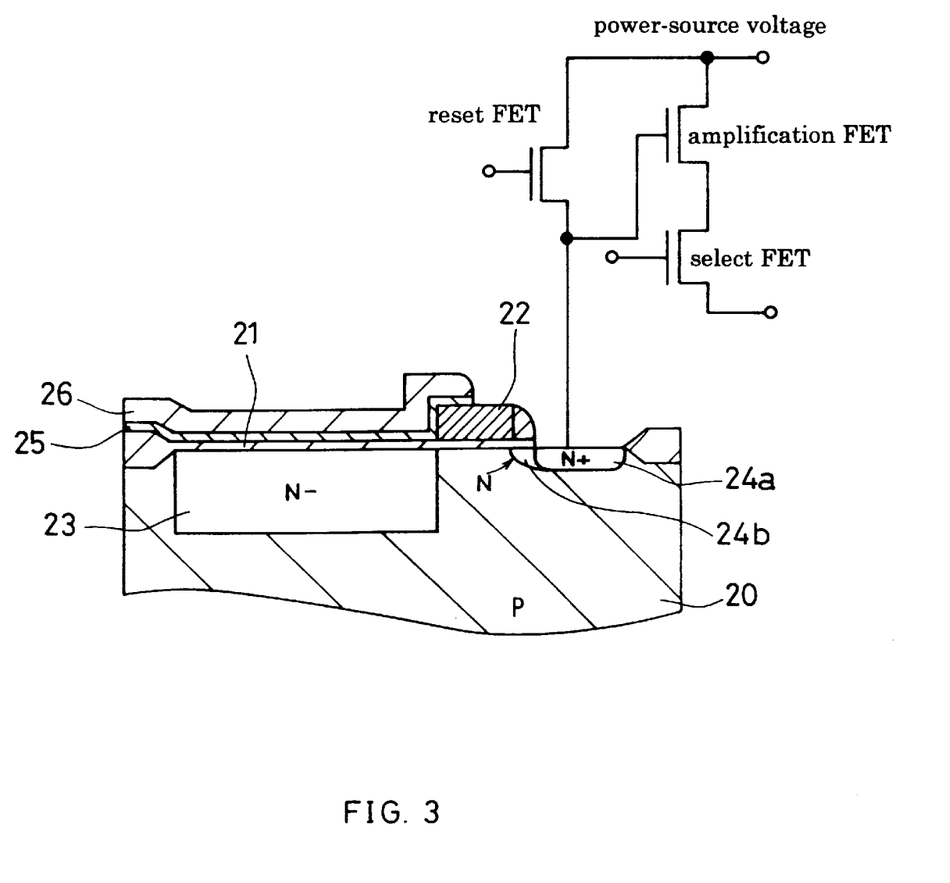
FIG. 3 is a cross-sectional view of an example of a solid-state imaging device in accordance with a second embodiment of the present invention.

FIG. 3 is a cross-sectional veiw of an example of a solid-state imaging device in accordance with the second embodiment of the present invention. As in the first embodiment, a photo-receiving portion 23, a detecting portion 24a and the LDD portion 24b are formed in a p-type silicon substrate 20. A gate electrode 22 is formed on an insulating film 21 formed on the silicon substrate 20. A reflection reducing film 25 is formed on the insulating film 21 above the photo-receiving portion 23. In the second embodiment, the reflection reducing film is not formed above the detecting portion 24a, either above the LDD portion 24b. That is, other than the reflection reducing film above the LDD portion (i.e. corresponding to the film 15b in FIG. 1) being removed completely, this solid-state imaging device has substantially the same configuration as the device of the first embodiment. And the materials to be used are the same as those of the first embodiment substantially.

Figure 4:
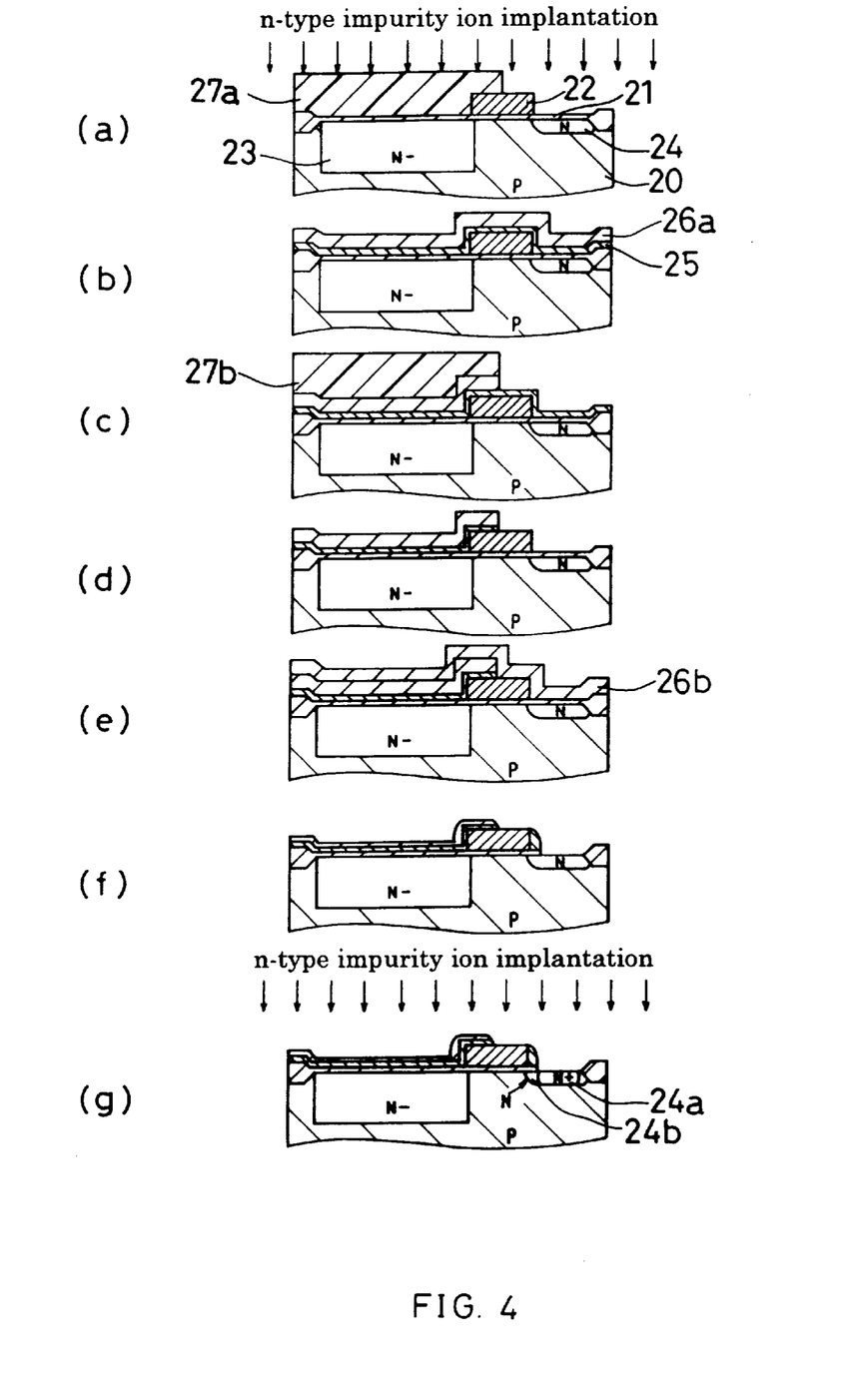
FIGS. 4(a) to 4(g) are cross-sectional views illustrating an example of a process for manufacturing a solid-state imaging device in accordance with the second embodiment of the present invention.

FIGS. 4 (a)–(g) are cross-sectional views illustrating one example of the steps for manufacturing a solid-state imaging device in accordance with this embodiment. FIGS. 4 (a)–(g) illustrate the steps for manufacturing a charge transfer transistor as shown in the cross-sectional view, FIG. 3. In the following, "detecting portion" means the region 24a in FIG. 3, and "LDD portion" means the region 24b in FIG. 3.

A silicon oxide film 21 and a transfer gate electrode 22 are formed on a silicon substrate 20. A photo-receiving portion 23, a detecting portion (the impurity concentration in the detecting portion formed at this stage is lower than the impurity concentration that is finally necessary and is the same as that of the LDD portion) and the LDD portion are formed in the silicon substrate 20. A silicon nitride film 25 and a silicon oxide film 26a are formed above the substrate 20. The above-mentioned steps can be performed in the same way as those of the first embodiment (FIG. 4(a), (b)). In the second embodiment, the thickness of the silicon oxide film 26a formed in the (b) step shown in FIG. 4 should be about 50–100 nm appropriately, and should be about 70 nm preferably.

Next, one part of the silicon oxide film 26a and the silicon nitride film 25 are removed by etching (FIG. 4(c), (d)). In the same way as in the first embodiment, this etching process concerns the region excluding the photo-receiving portion 23. The etching is performed while the mask is formed to cover at least one part of the photo-receiving portion 23, preferably to cover the entire part of the photo-receiving portion 23 and part of the transfer gate electrode 22. In the second embodiment, the etching at this stage is performed to remove completely the oxide film and the nitride film that are not covered with the mask. That is, the etching is performed to remove the oxide film and the nitride film above the LDD portion. Thus, it is preferable to use the wet etching as an isotropic etching technique. For example, a resist 27a is formed to cover the entire photo-receiving portion 23, a silicon oxide film 26 is removed by using hydrofluoric acid based etching solution (FIG. 4(c)), then the resist 27a is removed, and the silicon nitride film 26 is etched using phosphoric acid based etching solution at 155° C., using the remaining oxide film above the photo-receiving portion as a mask (FIG. 4(d)).

Next, a silicon oxide film 26b is deposited above the substrate (FIG. 4(e)). The silicon oxide film 26b is formed by low-pressure CVD using TEOS. Its thickness is preferably about 150–200 nm, more preferably about 190 nm. At this stage, the thickness of the oxide film formed above the photo-receiving portion 23 is larger than that of the oxide film formed above the detecting portion, since the oxide film 26b is deposited on the oxide film 26a that was deposited above the photo-receiving portion 23 in the (b) step.

Next, one part of the silicon oxide film 26b is removed by etching (FIG. 4(f)). In the etching at this stage, in the same way as that of the step shown in FIG. 2(c) in the first embodiment, the oxide film formed above the detecting portion is removed and the oxide film formed above the LDD portion remains. The dry etching such as RIE can be performed. As above-mentioned, since the thickness of the oxide film formed above the photo-receiving portion 23 is larger than that of the oxide film formed above the detecting portion, even if the etching is performed to remove the oxide film formed above the detecting portion completely, the oxide film formed above the photo-receiving portion remains. Consequently, the silicon nitride film formed above the photo-receiving portion 23 is not etched, and the function as a reflection reducing film of the silicon nitride film might not be damaged. It is preferable that the thickness of the remaining silicon oxide film formed above the photo-receiving portion 23 is about 20–30 nm appropriately.

Next, in the same way as that of the process shown in FIG. 2(d) in the first embodiment, another ion implantation is performed (FIG. 4(g)) to form a charge transfer transistor. In the same way as that of the first embodiment, an interlayer insulating film and metal wiring are formed above the silicon substrate whereon the charge transfer transistor has been formed. Furthermore, a light-blocking film, a surface protection film, and the like are formed as appropriate to manufacture the solid-state imaging device.

In the above-mentioned manufacturing method, although the silicon nitride film is used as the reflection reducing film, other materials mentioned in the first embodiment can be used. Further, the formation of films by thermal oxidation, CVD etc. or the etching in the above-mentioned manufacturing method can be selected from methods well known in the art.

According to the above-mentioned manufacturing method, a reflection reducing film is formed above the photo-receiving portion but is not formed above the LDD portion. As a result, the above-mentioned problems can be solved, the sensitivity and the quality of the image can be improved.

Third Embodiment

Figure 5:
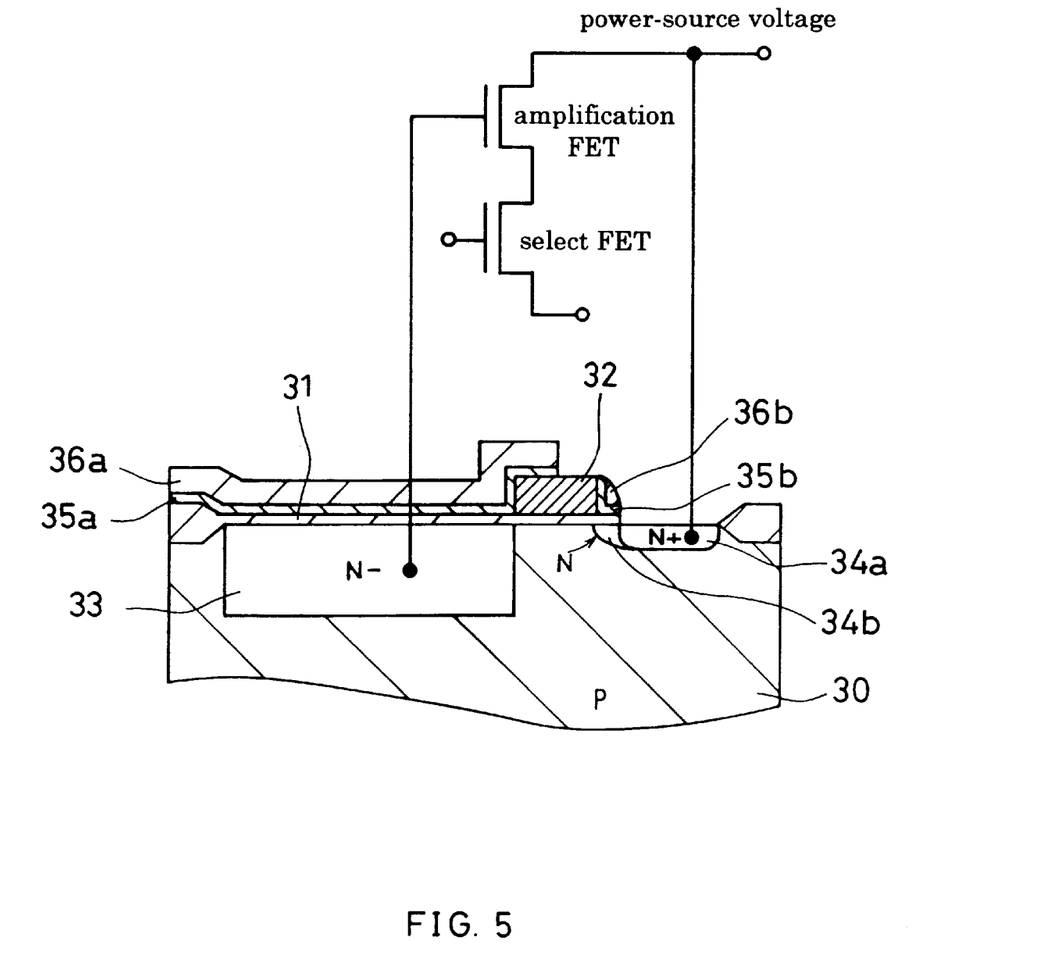
FIG. 5 is a cross-sectional view of an example of a solid-state imaging device in accordance with a third embodiment of the present invention.

FIG. 5 is a cross-sectional view of another example of a solid-state imaging device of the present invention. This solid-state imaging device gives out the potential difference occurring at a photo-receiving portion. Each pixel comprises a photo-receiving portion and three transistors: an amplification transistor, a reset transistor and a select transistor. The reset transistor takes a photo-receiving portion 33 as the source. The drain of the reset transistor is a diffusion region 34a, which is electrically connected to a power-source voltage. The gate of the amplification transistor is electrically connected to the photo-receiving portion 33, the source of the amplification transistor is electrically connected to a power-source voltage, and the drain of the amplification transistor is electrically connected to the source of the select transistor, respectively. The drain of the select transistor is connected to an output line.

The following is an outline of the role of each transistor. The amplification transistor amplifies the voltage provided by the photo-receiving portion 33. The select transistor acts as a switch for receiving the output from the amplification transistor, and selects the pixel from which the signal is read out. The read-out circuit in the pixels in this solid-state imaging device is the amplifying circuit comprising the amplification transistor and the select transistor. The reset transistor periodically releases the signal charge held by the photo-receiving portion 33 toward the diffusion region 34a, which is connected to the power-source voltage. In other words, the diffusion region 34a functions as a charge drain portion (hereinafter, the diffusion region 34a is referred to as "charge drain portion").

The following is an explanation of the region forming the reset transistor as shown in the cross-sectional view of FIG. 5, that is, the region forming the photo-receiving portion 33, the charge drain portion 34a and the gate electrode 32 (hereinafter, referred to as "reset electrode"). The configuration of this region is substantially the same as the configuration of the region forming the charge transistor in the first embodiment. Hereinafter, the details will be explained briefly.

A photo-receiving portion 33 and a charge drain portion 34a, which are n-type diffusion regions, are formed in a p-type silicon substrate 30. An insulating film 31 is formed on the p-type silicon substrate 30, and a reset gate electrode 32 is formed on the insulating film 31 above the region between the photo-receiving portion 33 and the charge drain portion 34a.

There is no particular limitation concerning the impurity concentration in the photo-receiving portion 33, other than that it should be suitable for photoelectric conversion and for an electrical connection with the metal wiring. It is preferable that the impurity concentration is about $10^{16}$–$10^{19}$ cm$^{-3}$. It is preferable that the diffusion depth is about 0.5–2.0 μm. Further, the photo-receiving portion 33 may be a buried photodiode, comprising the p-type diffusion region at the upper portion. There is no particular limitation concerning the impurity concentration in the charge drain portion 34a, other than that it should be suitable for an electrical connection with the metal wiring. It is preferable that the impurity concentration is about $10^{20}$ cm$^{-3}$. It is preferable that the diffusion depth is about 0.2–0.4 μm. Further, it is preferable that the LDD portion 34b with a lower impurity concentration than that of the charge drain portion 34a is formed at the end of the charge drain portion 34a near the reset gate electrode 32. It is appropriate that the impurity concentration in the LDD portion 34b is about $10^{18}$–$10^{19}$ cm$^{-3}$. Furthermore, not shown in the drawings, an interlayer film, a light-blocking film made of metal having an aperture above the photo-receiving portion 33 and a surface protection film are formed on the substrate.

In the solid-state imaging device of the present invention, an insulating film 31 is formed on the photo-receiving portion 33, and a reflection reducing film 35a is formed on the insulating film 31 above the photo-receiving portion 33. Although the reflection reducing film 35a may be formed to cover at least one part of the photo-receiving portion 33, it is preferable that the reflection reducing film 35a is formed to cover the entire photo-receiving portion 33. In this embodiment, a hole is formed in one part of the reflection reducing film 35a formed above the photo-receiving portion 33, since it is required for the photo-receiving portion to connect electrically with the amplification transistor by metal wiring.

Further, it is preferable that the reflection reducing film 35a is formed to cover also one part of the reset gate electrode 32 so as to cover the entire part of the photo-receiving portion 33 securely. In this case, it is preferable that the reflection reducing film is not formed above at least one part of the reset gate electrode. It is not required to form the reflection reducing film above the charge drain portion 34a, and rather, it is preferable not to form the reflection reducing film above at least one part of the charge drain portion 34a. Further, the same material as that mentioned in the first embodiment can be used for the reflection reducing film 35a.

And in this solid-state imaging device, the silicon oxide film 36a is formed on the reflection reducing film 35a. At the side of the reset gate electrode 32 near the charge drain portion 34a, a film 35b made of the material same as that of the reflection reducing film and a side wall-formed silicon oxide film 36b are formed.

Next, one example of the steps for manufacturing a solid-state imaging device in accordance with this embodiment will be explained referring to FIGS. 6 (a)–(d). A reset transistor in the solid-state imaging device in accordance with this embodiment can be manufactured by substantially the same process as that for manufacturing the charge transfer transistor in the first embodiment. In the following, "charge drain region" means the region 34a in FIG. 5, and "LDD portion" means the region 34b in FIG. 5.

An insulating film 31 and a reset gate electrode 32 are formed on a silicon substrate 30. The photo-receiving portion 33 is formed in the silicon substrate 30 by the ion implantation. This ion implantation is performed preferably at an acceleration field strength of 600 keV and an implantation dose of $10^{12}$–$10^{4}$ cm$^{-2}$.

Next, a charge drain portion (the impurity concentration in the charge drain portion formed at this stage is lower than the impurity concentration that is finally necessary and is same as that of the LDD portion) and the LDD portion are formed in the silicon substrate 30 (FIG. 6(a)). This ion implantation is performed, for example, at an acceleration field strength of 50–80 keV, and an implantation dose of $2\times10^{13}$ cm$^{-2}$, and preferably is repeated several times while changing the orientation of the substrate.

Figure 6:
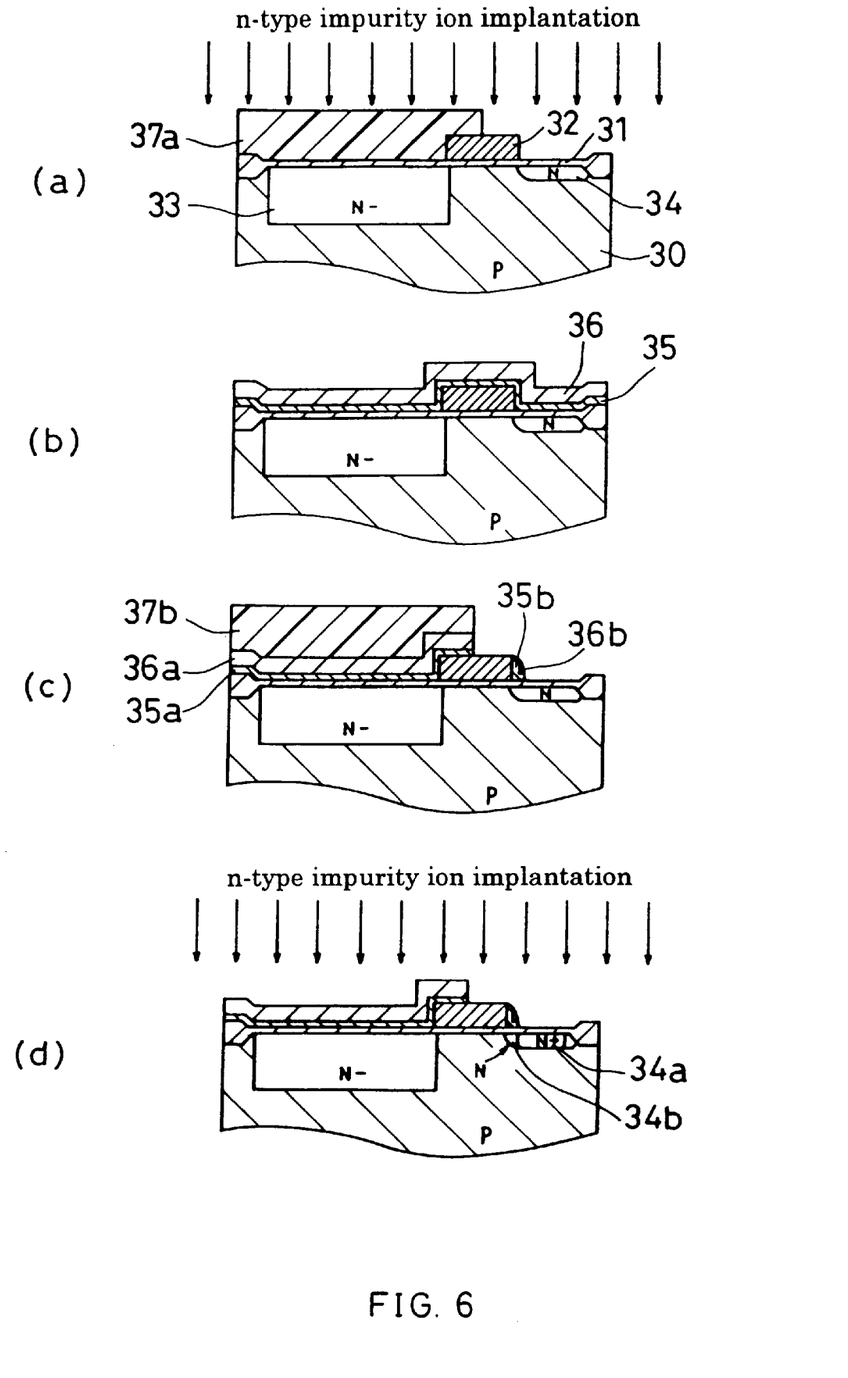
FIGS. 6(a) to 6(d) are cross-sectional views illustrating an example of process for manufacturing a solid-state imaging device in accordance with the third embodiment of the present invention.

A silicon nitride film 35 and a silicon oxide film 36 are formed above the substrate (FIG. 6(*b*)) and one part of these films is removed by etching (FIG. 6(*c*)). This etching process concerns the region excluding the photo-receiving portion 33. The etching is performed while a resist 37*b* covers at least one part of the photo-receiving portion 33. As a result, the silicon nitride film formed above the charge drain portion is removed but the silicon nitride film 35*a* above the photo-receiving portion 33 remains. The remaining nitride film 35*a* functions as a reflection reducing film. Further, this etching is performed in a manner that the silicon oxide film 36*b* above the LDD portion remains.

Next, the second ion implantation is performed so as to increase the impurity concentration in the charge drain portion to the desirable concentration. This ion implantation is performed, for example, at an acceleration field strength of 20–30 keV and at an implantation dose of $5 \times 10^{15}$ cm$^{-2}$ (FIG. 6(*d*)).

Next, an interlayer insulating film is formed on the silicon substrate whereon the reset transistor has been formed. For example, a silicon oxide film formed by low-pressure CVD is used as the interlayer insulating film. Next, a hole through the reflection reducing film 35*a*, the silicon oxide film 36*a* and the interlayer insulating film formed above the photo-receiving portion 33 is formed by etching, and then a metal film such as aluminum is formed. The metal film is patterned by etching to form the metal wiring. The metal wiring connects electrically the photo-receiving portion 33 to the gate electrode of the amplification transistor formed in another region of the silicon substrate. Further, after a hole has been formed in the interlayer insulating film above the charge drain portion 34*b*, another metal film is formed on the interlayer insulating film. The metal film is patterned by etching to form the metal wiring. The metal wiring connects electrically the charge drain portion 34*b* and the source voltage. Furthermore, a lightblocking film, a surface protection film, and the like are formed as appropriate to manufacture the solid-state imaging device.

In the above-mentioned manufacturing method, although the film including the silicon nitride film is used as the reflection reducing film, other materials mentioned above can be used. Further, the formation of various kinds of films and the etching in the above-mentioned manufacturing method can be performed in the same way as that of the first embodiment.

Fourth Embodiment

In the solid-state imaging device in the third embodiment, it is preferable that there is not any discontinuous part of the reflection reducing film, formed above the charge drain portion (including the LDD portion) near the reset gate electrode. In other words, it is preferable that the reflection reducing film is not contacted with the side of the reset gate electrode near the charge drain portion. Further, it is preferable that the reflection reducing film is not formed above the LDD portion. A fourth embodiment of this invention as the above-mentioned preferable example will be explained in the following.

Figure 7:
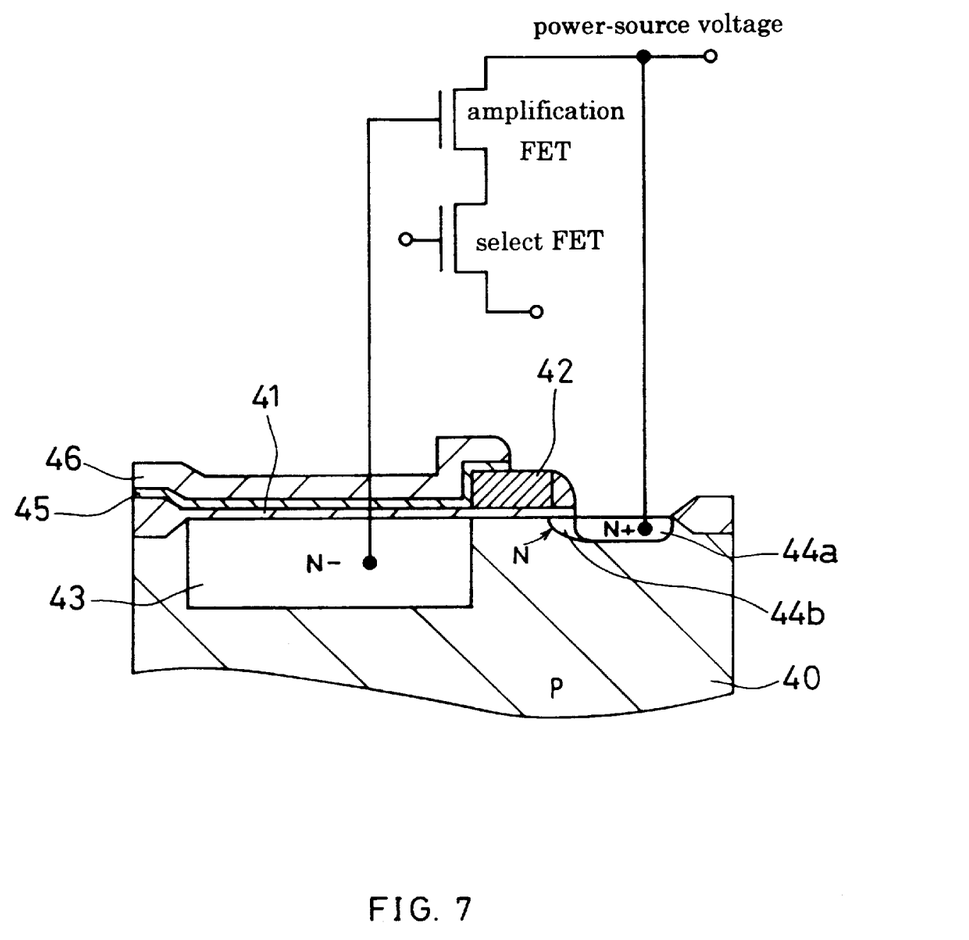
FIG. 7 is a cross-sectional view of an example of a solid-state imaging device in accordance with a fourth embodiment of the present invention.

FIG. 7 is a cross-sectional drawing of an example of a solid-state imaging device in accordance with the fourth embodiment of the present invention.

As in the third embodiment, a photo-receiving portion 43, a charge drain portion 44*a* and the LDD portion 44*b* are formed in a p-type silicon substrate 40. A reset gate electrode 42 is formed on an insulating film 41 formed on the silicon substrate 40. A reflection reducing film 45 is formed on the insulating film 41 above the photo-receiving portion 43. In the fourth embodiment, the reflection reducing film is not formed above the charge drain portion 44*a*, or above the LDD portion 44*b*. That is, other than that the reflection reducing film above the LDD portion (i.e. corresponding to the film 35*b* in FIG. 5) is removed completely, this solid-state imaging device has substantially the same configuration as the device of the third embodiment. And the materials to be used are substantially the same as those of the third embodiment.

Next, one example of the steps for manufacturing a solid-state imaging device in accordance with this embodiment will be explained referring to FIGS. 8 (*a*)–(*g*). A reset transistor in the solid-state imaging device in accordance with this embodiment can be manufactured by substantially the same process as that for manufacturing the charge transfer transistor in the second embodiment. In the following, "charge drain portion" means the region 44*a* in FIG. 7, and "LDD portion" means the region 44*b* in FIG. 7.

An insulating film 41 and a reset gate electrode 42 are formed on a silicon substrate 40. A photo-receiving portion 43, a charge drain portion (the impurity concentration in the charge drain portion formed at this stage is lower than the impurity concentration that is finally necessary and is the same as that of the LDD portion) and the LDD portion are formed in the silicon substrate 40 (FIG. 8(*a*)). Next, a silicon nitride film 45 and a silicon oxide film 46*a* are formed above the silicon substrate 40 (FIG. 8(*b*)).

Figure 8:
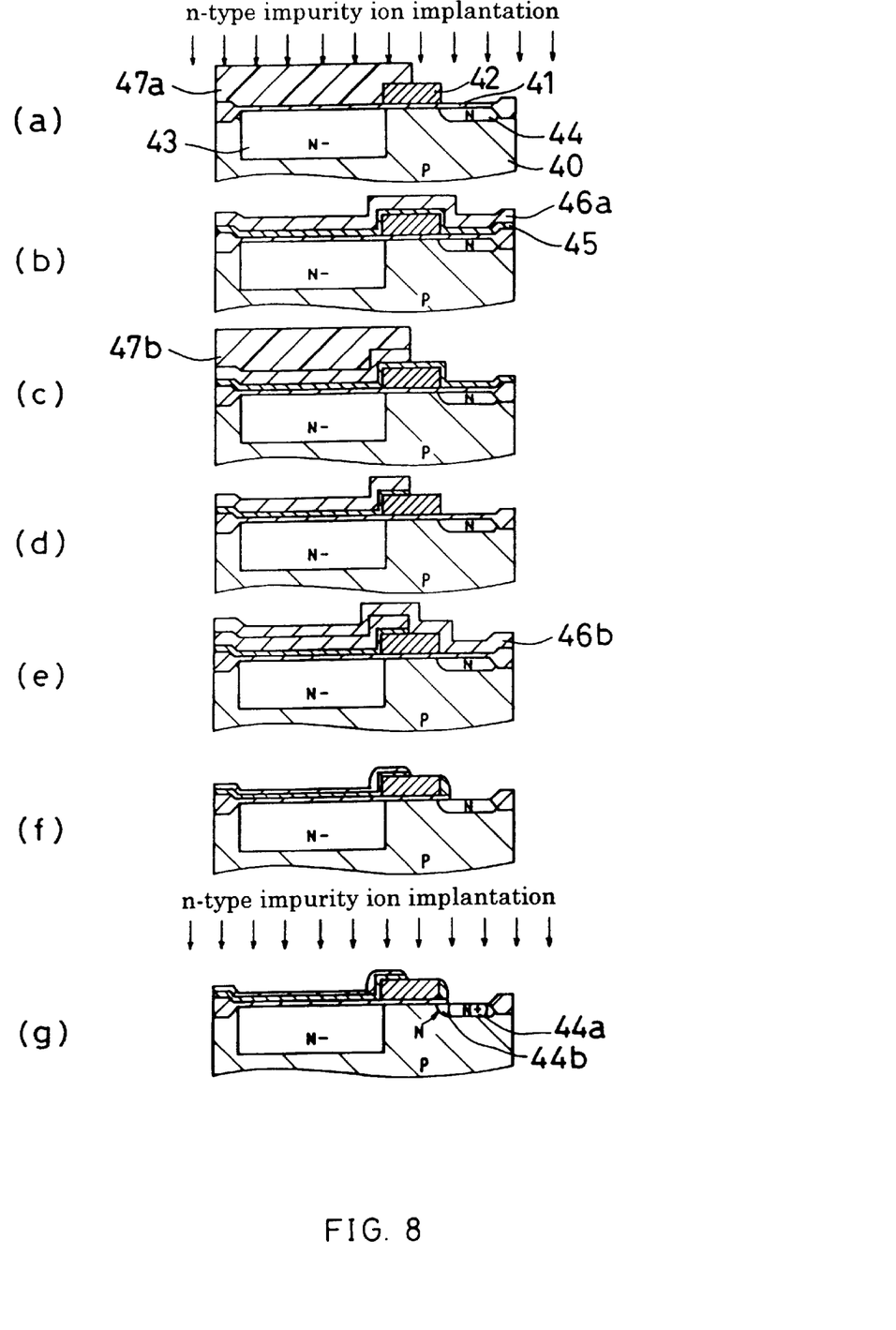
FIGS. 8(a) to 8(g) are cross-sectional views illustrating an example of process for manufacturing a solid-state imaging device in accordance with the fourth embodiment of the present invention.

Next, one part of the silicon oxide film 45 and the silicon nitride film 46*a* are removed by etching (FIG. 8(*c*), (*d*)). This etching process concerns the region excluding the photo-receiving portion 43. The etching is performed while the resist 47*b* covers the region forming the photo-receiving portion 43. As a result, the silicon nitride film formed above the charge drain portion is removed but the silicon nitride film formed above the photo-receiving portion 43 remains. The remaining nitride film functions as a reflection reducing film. Further, this etching is performed to remove the silicon oxide film and the silicon nitride film formed above the LDD portion.

Next, a silicon oxide film 46*b* is deposited above the silicon substrate (FIG. 8(*e*)) and etching is performed (FIG. 8(*f*)). This etching is performed in a manner that the silicon oxide film formed above the charge drain portion is removed and the silicon oxide film formed above the LDD portion remains.

Next, another ion implantation is performed to increase the impurity concentration in the charge drain portion to the desirable concentration.

In the same manner as the third embodiment, an interlayer insulating film and metal wiring are formed above the silicon substrate whereon the reset transistor has been formed. Furthermore, a light-blocking film, a surface protection film, and the like are formed as appropriate to manufacture the solid-state imaging device.

In the above-mentioned manufacturing method, although the film including the silicon nitride film is used as the reflection reducing film, other materials mentioned above such as the oxide film can be used. Further, the formation of various kinds of films and the etching in the above-mentioned manufacturing method can be performed in the same way as that of the second embodiment.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A solid-state imaging device comprising a plurality of pixels, each pixel comprising:
   a semiconductor substrate;
   a photo-receiving portion formed in the semiconductor substrate;
   a diffusion region formed in the semiconductor substrate;
   a first insulating film formed on the semiconductor substrate;
   a gate electrode formed on the first insulating film at least between the photo-receiving portion and the diffusion region; and
   a read-out circuit, which is electrically connected to either one of the photo-receiving portion and the diffusion region;
   wherein a reflection reducing film is formed on the first insulating film above a region of the semiconductor substrate including at least part of the photo-receiving portion and excluding at least part of the diffusion region, the reflection reducing film including a material whose refractive index is smaller than that of silicon and is larger than that of silicon oxide.

2. The solid-state imaging device according to claim 1, wherein the reflection reducing film is formed not to be in contact with the side of the gate electrode near the diffusion region.

3. The solid-state imaging device according to claim 1, wherein the reflection reducing film is formed above a region of the semiconductor substrate excluding at least part of the region on which the gate electrode is formed.

4. The solid-state imaging device according to claim 1, wherein the reflection reducing film includes at least one material selecting from the group consisting of silicon nitride, silicon oxynitride, cerium oxide, titanium oxide, tantalum oxide and zirconium oxide.

5. The solid-state imaging device according to claim 1, wherein the thickness of the reflection reducing film is 20–100 nm.

6. The solid-state imaging device according to claim 1, wherein a second insulating film is formed on the reflection reducing film.

7. A solid-state imaging device comprising a plurality of pixels, each pixel comprising:
   a semiconductor substrate;
   a photo-receiving portion formed in the semiconductor substrate;
   a diffusion region formed in the semiconductor substrate;
   a first insulating film formed on the semiconductor substrate;
   a gate electrode formed above the semiconductor substrate at least between the photo-receiving portion and the diffusion region; and
   a read-out circuit, which is electrically connected to either one of the photo-receiving portion and the diffusion region;
   wherein a reflection reducing film is formed on the first insulating film above a region of the semiconductor substrate including at least part of the photo-receiving portion and excluding at least part of the diffusion region, and the reflection reducing film includes a material whose refractive index is smaller than that of silicon and is larger than that of silicon oxide.

8. The solid-state imaging device according to claim 7, wherein the reflection reducing film is formed not to be in contact with the side of the gate electrode near the diffusion region.

9. The solid-state imaging device according to claim 7, wherein the reflection reducing film is formed above a region of the semiconductor substrate excluding at least part of the region on which the gate electrode is formed.

10. The solid-state imaging device according to claim 7, wherein the reflection reducing film includes at least one material selecting from the group consisting of silicon nitride, silicon oxynitride, cerium oxide, titanium oxide, tantalum oxide and zirconium oxide.

11. The solid-state imaging device according to claim 7, wherein the thickness of the reflection reducing film is 20–100 nm.

12. The solid-state imaging device according to claim 7, wherein a second insulating film is formed on the reflection reducing film.

* * * * *